(12) United States Patent
Singer et al.

(10) Patent No.: US 9,046,258 B2
(45) Date of Patent: Jun. 2, 2015

(54) OPTOELECTRONIC LIGHTING MODULE AND AUTOMOTIVE HEADLAMP

(75) Inventors: Frank Singer, Regenstauf (DE);
Thomas Haug, Ingolstadt (DE);
Alexander Sauerer, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 181 days.

(21) Appl. No.: 13/695,966

(22) PCT Filed: Jun. 24, 2011

(86) PCT No.: PCT/EP2011/060646
§ 371 (c)(1),
(2), (4) Date: Jan. 11, 2013

(87) PCT Pub. No.: WO2012/016759
PCT Pub. Date: Feb. 9, 2012

(65) Prior Publication Data
US 2013/0100691 A1  Apr. 25, 2013

(30) Foreign Application Priority Data
Aug. 2, 2010 (DE) .......................... 10 2010 033 093

(51) Int. Cl.
*F21V 29/00* (2006.01)
*F21K 99/00* (2010.01)
(Continued)

(52) U.S. Cl.
CPC . *F21V 29/22* (2013.01); *F21K 9/00* (2013.01); *F21S 48/115* (2013.01); *F21V 29/004* (2013.01); *F21Y 2101/02* (2013.01); *H01L 33/641* (2013.01); *H05K 1/021* (2013.01);

*H05K 2201/0397* (2013.01); *H05K 2201/09081* (2013.01); *H05K 2201/10106* (2013.01);
(Continued)

(58) Field of Classification Search
CPC ...... B60Q 1/04; F21S 48/1104; F21S 48/115;
F21V 29/004; F21V 29/22; H01L 33/641;
H05K 1/021; H05K 2201/0397; H05K
2201/09063; H05K 2201/09072; H05K
2201/09081; H05K 2201/10106
USPC ................................... 362/218, 294, 373, 646
See application file for complete search history.

(56) References Cited

U.S. PATENT DOCUMENTS 6,498,355 B1  12/2002 Harrah et al.
6,582,100 B1 * 6/2003 Hochstein et al. ............ 362/294
(Continued)

FOREIGN PATENT DOCUMENTS

DE  20 2006 017 583 U1  3/2008
DE  10 2007 049 310 A1  4/2009
(Continued)

*Primary Examiner* — Y M Lee
(74) *Attorney, Agent, or Firm* — Slater & Matsil, L.L.P.

(57) ABSTRACT

In at least one embodiment, an optoelectronic lighting module includes a circuit board, which an opening passes right through. The circuit board includes fastening devices for mechanically fastening the lighting module to an external heat sink. A carrier of the lighting module is mounted in the opening. At least one optoelectronic semiconductor chip is located on a carrier top and is connected electrically to the circuit board via the carrier. The circuit board is moreover connected firmly mechanically with the carrier. The circuit board is additionally designed to exert a mechanical force on the carrier and to press the carrier against the external heat sink. The carrier is designed to rest with a carrier bottom flat against the external heat sink.

17 Claims, 6 Drawing Sheets

(51) Int. Cl.
*H05K 1/02* (2006.01)
*B60Q 1/04* (2006.01)
*F21S 8/10* (2006.01)
*F21Y 101/02* (2006.01)
*H01L 33/64* (2010.01)

(52) U.S. Cl.
CPC ............... *B60Q1/04* (2013.01); *F21S 48/1104* (2013.01); *H01L 2924/0002* (2013.01)

(56) References Cited

U.S. PATENT DOCUMENTS

| | | |
|---|---|---|
| 7,868,339 B2 | 1/2011 | Stoyan et al. |
| 7,905,632 B2 | 3/2011 | Dobler et al. |
| 8,602,593 B2 * | 12/2013 | Markle et al. ................ 362/373 |
| 2006/0141851 A1 | 6/2006 | Matsui et al. |
| 2008/0008427 A1 | 1/2008 | Takeda et al. |
| 2010/0067251 A1 | 3/2010 | Tokunaga |

FOREIGN PATENT DOCUMENTS

| | | |
|---|---|---|
| DE | 10 2008 031 262 A1 | 1/2010 |
| EP | 1 936 263 A1 | 6/2008 |
| JP | 2008-016362 A | 1/2008 |
| JP | 2008-186796 A | 8/2008 |
| JP | 2008-235118 A | 10/2008 |
| WO | WO 2010/000614 A1 | 1/2010 |

* cited by examiner

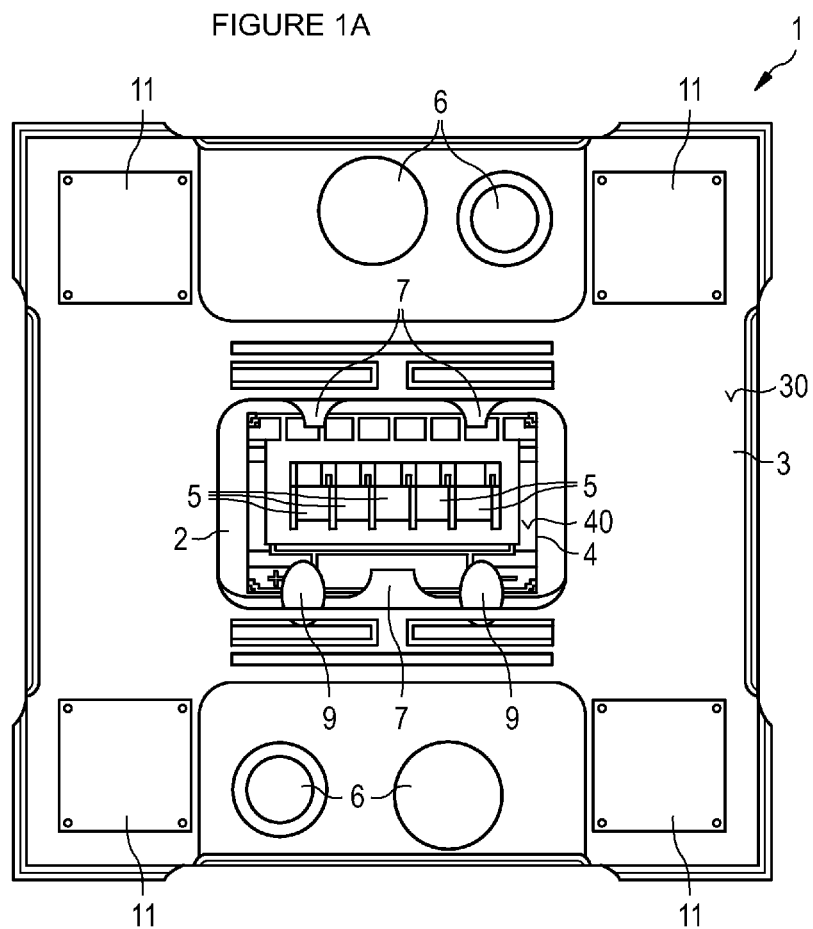

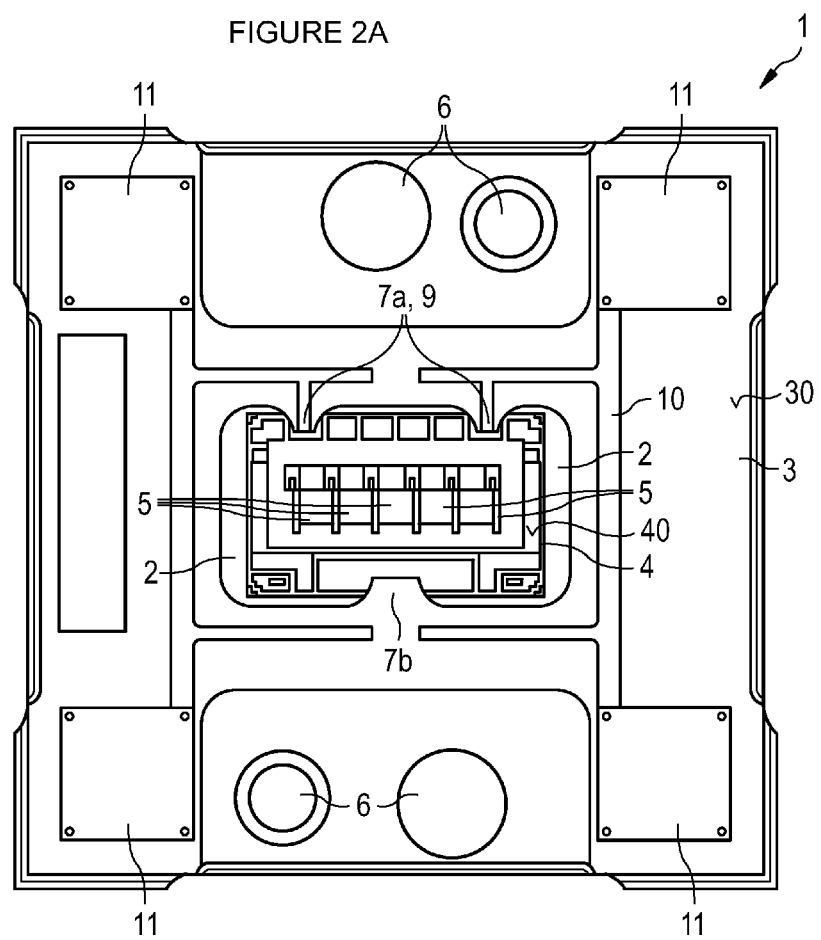

OPTOELECTRONIC LIGHTING MODULE AND AUTOMOTIVE HEADLAMP

This patent application is a national phase filing under section 371 of PCT/EP2011/060646, filed Jun. 24, 2011, which claims the priority of German patent application 10 2010 033 093.0, filed Aug. 2, 2012, each of which is incorporated herein by reference in its entirety.

TECHNICAL FIELD

The invention relates to an optoelectronic lighting module. The invention also relates to an automotive headlamp with such a lighting module.

BACKGROUND

U.S. Patent Application Publication 2008/0008427 A1 discloses a light-emitting module and a lighting component for a vehicle.

SUMMARY OF THE INVENTION

One aspect of the invention provides a lighting module from which heat may be efficiently dissipated.

According to at least one embodiment of the optoelectronic lighting module, the latter contains a circuit board. The circuit board is for example a metal core board or a board with a core based in particular on an epoxide, to which a metallic layer is applied, wherein the metallic layer is patterned to form conductor tracks and may be covered at least in places by a further dielectric layer. It is likewise possible for the circuit board to be an injection-moulded circuit carrier or Moulded Interconnect Device (MID for short).

According to at least one embodiment of the lighting module, the circuit board has an opening passing right through it. In other words, the opening extends from a circuit board top to a circuit board bottom opposite thereto. Opening means in particular that a hole is formed in the circuit board, which is surrounded on at least three sides, preferably on at least four sides or all around, by a material of the circuit board.

According to at least one embodiment of the lighting module, the circuit board comprises at least one fastening device. The fastening device is designed to fasten the lighting module to an external heat sink, which is not part of the lighting module. The fastening device contains for example recesses for accommodating screws.

According to at least one embodiment of the lighting module, the latter comprises a carrier. Preferably, the carrier consists of or comprises a material of high thermal conductivity. For example the average, specific thermal conductivity of the carrier amounts to at least 50 W/(m·K) or at least 80 W/(m·K) or at least 120 W/(m·K). The carrier is mounted in the opening in the circuit board. A major part of the carrier, for example at least 50% or at least 80%, may be located in the opening, i.e., in projection onto a plane perpendicular to the circuit board top in particular between the circuit board bottom and the circuit board top.

According to at least one embodiment of the lighting module, the latter comprises at least one optoelectronic semiconductor chip, which is mounted on the top of the carrier. The semiconductor chip is preferably a light-emitting diode. The light-emitting diode is designed in particular to generate blue light, white light or near infrared radiation. A semiconductor layer sequence of the optoelectronic semiconductor chip may be based on a III-V compound semiconductor material, for example on GaN, InGaN, AlGaN or InAlGaN.

According to at least one embodiment of the lighting module, the semiconductor chip is connected electrically to the circuit board via the carrier. In other words, the semiconductor chip is not directly contacted electrically with the circuit board, but rather only indirectly via the carrier. For example, conductor tracks for contacting the semiconductor chip are located on the carrier, which are contacted via a bonding agent with conductor tracks on the circuit board.

According to at least one embodiment of the lighting module, the circuit board is connected firmly mechanically to the carrier. This may mean that, when the lighting module is being used correctly, the circuit board will not separate from the carrier or vice versa. The lighting module may in particular be handled as a single, integral unit. Preferably, the circuit board and the carrier are connected firmly together such that, on mounting for example on an external heat sink no significant relative displacement of the circuit board takes place in a lateral direction relative to the carrier. Such displacement preferably amounts to at most 250 μm or at most 100 μm.

According to at least one embodiment of the lighting module, the circuit board is designed to exert a mechanical force on the carrier and to press the carrier against the external heat sink. When mounted, the carrier is then pressed against the heat sink via the circuit board. The circuit board may in particular be firmly mounted via the fastening device directly on the heat sink and the carrier only indirectly via the circuit board. The lighting module is particularly preferably free of a bonding agent or of a fastening device which is designed to connect the carrier directly firmly mechanically to the external heat sink.

According to at least one embodiment of the lighting module, the carrier is designed to rest flat on the external heat sink with a carrier bottom opposite the carrier top bearing the semiconductor chip. The carrier bottom is preferably of planar construction. Toothed engagement or meshing of parts of the carrier bottom with parts of the heat sink is not provided. The carrier is specifically designed to be mounted on a heat sink top of planar shape. In this way, a large bearing area and good thermal coupling of the carrier to the external heat sink may be ensured.

In at least one embodiment of the optoelectronic lighting module, the latter comprises a circuit board, which an opening passes right through. The circuit board comprises at least one, preferably at least two or precisely two fastening devices for mechanical fastening of the lighting module to an external heat sink. A lighting module carrier is mounted in the opening. At least one optoelectronic semiconductor chip is located on the top of the carrier and is connected electrically to the circuit board via the carrier. The circuit board is moreover connected firmly mechanically with the carrier. The circuit board is additionally designed to exert a mechanical force on the carrier and to press the carrier against the external heat sink. The carrier is designed to rest with a carrier bottom flat against the external heat sink.

In the lighting module described, the carrier is intended in particular to be mounted flat and without bonding agent on an external heat sink. It is alternatively possible to fasten a carrier on the heat sink via a bonding agent located between the carrier and the heat sink.

Suitable materials for the carrier, with high thermal conductivity and thermal expansion similar to that of the semiconductor chip, are for example ceramics. Ceramics typically exhibit a coefficient of thermal expansion of approx. $5 \times 10^{-6}$ $K^{-1}$. Metals for a heat sink such as aluminium or copper on the other hand exhibit a comparatively high coefficient of thermal expansion in the range from approx. $15 \times 10^6$ $K^{-1}$ to approx. $25 \times 10^6$ $K^{-1}$. A bonding agent must therefore be capable of compensating the differences in the coefficient of thermal expansion, since otherwise the carrier may become detached from the heat sink after the lighting module has been switched on and off repeatedly.

Bonding agents consisting of rigid metallic solders or for example epoxides combined with silver are not as a rule capable of compensating the tensions arising due to the different coefficients of thermal expansion between the carrier and the heat sink. For this purpose, comparatively soft, in particular silicone-based adhesives are needed, which are for example filled with barium nitride. However, such adhesives exhibit comparatively low thermal conductivity of the order of 2 W/(m·K) and should additionally be applied in comparatively large film thicknesses of between 20 μm and 60 μm. The high thermal resistance of the bonding agent layer thus significantly reduces the heat dissipation capacity of the lighting module. Because, in the case of the lighting module described herein, the carrier may be pressed directly and without bonding agent on the heat sink via the circuit board, thermal resistance between the heat sink and the carrier may be reduced and heat dissipation capacity may be increased.

According to at least one embodiment of the lighting module, the carrier bottom and the circuit board bottom are in each case of planar shape and oriented parallel to one another, within the bounds of manufacturing tolerances.

According to at least one embodiment of the lighting module, the carrier bottom projects out of the opening in which the carrier is mounted. The projection amounts to more than 0 μm. The projection preferably amounts to at most 100 μm. The projection is between 10 μm and 100 μm inclusive, in particular between 10 μm and 50 μm inclusive. The carrier bottom projects beyond the circuit board bottom preferably only provided that the lighting module is not mounted on the external heat sink. If the lighting module is mounted on the heat sink, the circuit board bottom and the carrier bottom preferably extend in a common plane, in which a heat sink top may also lie.

According to at least one embodiment of the optoelectronic lighting module, the circuit board is designed to press the carrier with a mechanical force of between 5 N and 100 N inclusive, in particular of between 15 N and 80 N inclusive or between 40 N and 80 N inclusive against the external heat sink. Alternatively or in addition, the circuit board is designed to press the carrier bottom with an average pressure of between 0.2 MPa and 20 MPa inclusive, preferably between 0.25 MPa and 5 MPa inclusive, against the heat sink top.

According to at least one embodiment of the lighting module, the latter comprises at least two fastening tongues. The fastening tongues extend as an extension of the circuit board top and partially cover the opening in the circuit board, when viewed in plan view. The fastening tongues are preferably connected firmly mechanically and/or electrically with the carrier top. The connection between the fastening tongues and the carrier is designed such that it does not come undone when the lighting module is being used correctly.

According to at least one embodiment of the lighting module, the fastening tongues are designed to press the carrier against the external heat sink. In other words, the fastening tongues exert a force in a direction perpendicular to the carrier bottom on the carrier.

According to at least one embodiment of the lighting module, the fastening tongues are formed in one piece with the circuit board. In particular, when producing the opening in the circuit board, certain material regions, which form the fastening tongues and project into the opening, are not removed. The fastening tongues are then not produced separately and not mounted subsequently on the circuit board, but rather the fastening tongues are integral components of the circuit board. The fastening tongues may thus be made at the same time as the opening.

According to at least one embodiment of the lighting module, the fastening tongues comprise a mechanically resiliently deformable material or consist thereof. In particular, the material of the fastening tongues is resiliently deformable over the entire temperature range within which the lighting module may be used correctly.

According to at least one embodiment of the lighting module, the fastening tongues exhibit a spring constant, in a direction perpendicular to the carrier top and/or to the carrier bottom, which is between 50 kN/m and 5 MN/m inclusive or between 250 kN/m and 3 MN/m inclusive. In other words, the fastening tongues allow an elevated force to be exerted on the carrier with comparatively little spring excursion.

According to at least one embodiment of the lighting module, at least one of the fastening tongues or all of the fastening tongues are electrically insulated from the semiconductor chip. Electrical contacting is then preferably separate from mechanical contacting of the carrier.

According to at least one embodiment of the lighting module, the average distance in a lateral direction between the circuit board and the carrier is between 150 μm and 750 μm inclusive. The circuit board and the carrier are thus located comparatively close to one another in the lateral direction.

According to at least one embodiment of the lighting module, the circuit board surrounds the carrier form-fittingly in the lateral direction. The circuit board preferably surrounds the carrier completely and form-fittingly in the lateral direction.

According to at least one embodiment of the lighting module, the coefficients of thermal expansion of the material of the circuit board and of the material of the carrier differ by at most a factor of 4, preferably by at most a factor of 3. The similar coefficients of expansion may reduce the thermal load on the lighting module.

According to at least one embodiment of the lighting module, the material of the carrier is more brittle at a temperature of 400 K than a material mechanically supporting the circuit board. For example, the carrier comprises a ceramic material or consists of such a material. Ceramics are comparatively brittle materials, which may be mechanically processed only with relatively major effort. The load-bearing, less brittle material of the circuit board, preferably a metal or a metal alloy, is easier to process. In particular, it takes less effort to form the fastening devices in the circuit board than in the carrier.

According to at least one embodiment of the lighting module, the carrier bottom exhibits an average roughness of at most 10 μm, in particular of at most 5 μm or of at most 2 μm. In other words, the carrier bottom is comparatively smooth. The average roughness is also denoted $R_a$.

The invention further relates to an automotive headlamp. The automotive headlamp contains at least one optoelectronic lighting module, as described in conjunction with one or more of the above-stated embodiments. Features of the automotive headlamp are therefore also disclosed for the optoelectronic lighting module and vice versa.

In at least one embodiment of the automotive headlamp, the latter contains at least one heat sink, the lighting module being fastened to the top of the heat sink and in particular the carrier bottom being pressed by the circuit board against the heat sink top.

BRIEF DESCRIPTION OF THE DRAWINGS

An optoelectronic semiconductor component described herein and an automotive headlamp described herein will be explained in greater detail below with reference to the drawings and with the aid of exemplary embodiments. Elements which are the same in the individual figures are indicated with the same reference numerals. The relationships between the elements are not shown to scale, however, but rather individual elements may be shown exaggeratedly large to assist in understanding.

DETAILED DESCRIPTION OF ILLUSTRATIVE EMBODIMENTS

Figure 1B:
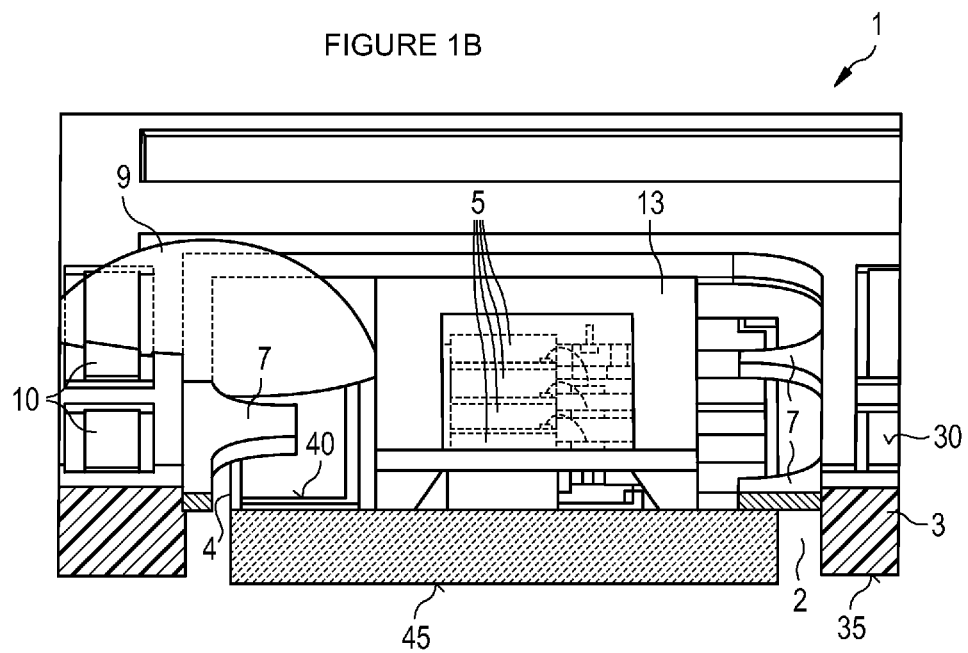
FIGS. 1 to 4 show schematic representations of exemplary embodiments of optoelectronic lighting modules described herein.
Figure 1C:
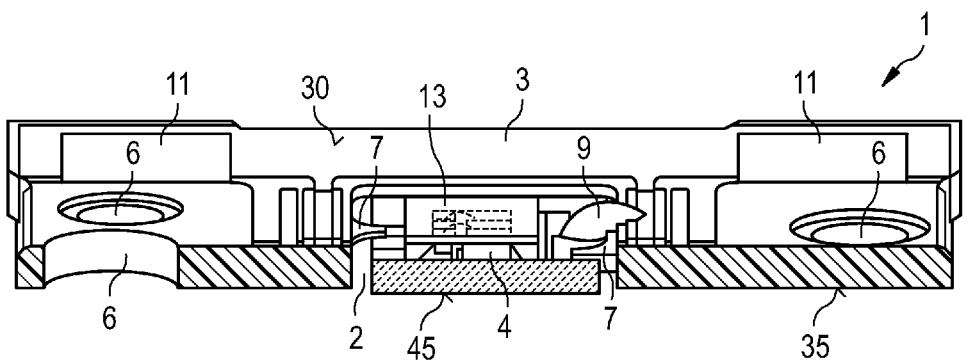

FIG. 1, which includes FIGS. 1A-1C, shows an exemplary embodiment of a lighting module 1. The schematic plan view is shown in FIG. 1A and schematic perspective sectional representations are shown in FIGS. 1B and 1C.

A circuit board 3 comprises an opening 2. A carrier 4 is mounted in the opening 2. Optoelectronic semiconductor chips 5 are located on the top 40 of the carrier 4. A mechanical connection between the carrier 4 and the circuit board 3 is produced by fastening tongues 7. An electrical connection is produced between conductor tracks 10 of the circuit board 3 and the carrier 4 by electrical bridges 9, which include a bonding wire encapsulated by a potting compound. To fasten the lighting module 1 to an external heat sink, not shown, which is not part of the lighting module 1, the circuit board 3 comprises fastening devices 6, which may serve as a guide for screws, for example, by means of which the lighting module 1 may be screwed onto the heat sink. For electrical contacting of the lighting module 1, solder pads 11 are arranged in each of the corner areas of the circuit board 3, these being connected electrically to the conductor tracks 10.

The circuit board 3 according to FIG. 1 is a metal core printed circuit board. The fastening tongues 7 consist of a material of the metal core of the circuit board 3. The fastening tongues 7 are thus formed in one piece with the circuit board 3. The fastening tongues 7 are mechanically resilient and deform when the lighting module 1 is mounted on the external heat sink, whereby a mechanical force is exerted on the carrier 4 and the carrier 4 is pressed onto the heat sink, not shown. To enable this, a carrier bottom 45, opposite the carrier top 40, projects beyond a circuit board bottom 35, in a direction perpendicular to the carrier top 40 and perpendicular to the carrier bottom 45.

The fastening tongues 7 are electrically insulated from the semiconductor chips 5. For example, the fastening tongues 7 are soldered or adhered to the carrier top 40. It is alternatively possible for a mechanical connection to be produced between the carrier 4 and the circuit board 3 by a potting material of the electrical bridge 9.

The carrier 4 contains, for example, a ceramic such as aluminium nitride or aluminium oxide or consists of such a ceramic. It is likewise possible for the carrier 4 to comprise silicon nitride or silicon carbide or to consist thereof or for the carrier 4 to be made of a semiconductor material such as silicon or germanium. If the carrier 4 comprises an electrically conductive material, this is preferably provided at least in places with a thin passivation layer, for example of silicon nitride, which exhibits only negligible thermal resistance.

Lateral dimensions of the carrier 4 are for example between 3 mm×5 mm and 5 mm×8 mm inclusive, if the lighting module 1 comprises a plurality of semiconductor chips 5, or between 1 mm×4 mm and 3 mm×5 mm inclusive, if the lighting module contains just one single semiconductor chip 5, unlike in FIG. 1. For example, when the lighting module 1 is being correctly operated, waste heat of at least 3 W arises per semiconductor chip 5. In order to dissipate this waste heat efficiently, the thermal resistance of the lighting module 1, calculated from an active radiation-generating layer of the semiconductor chip 5 as far as the carrier bottom 45, amounts to at most 2.0 K/W or at most 1.5 K/W.

The fastening tongues 7 extend for example between 0.3 mm and 1.0 mm inclusive into the opening 2. The thickness of the fastening tongues 7 is for example between 0.2 mm and 1.0 mm inclusive. A core material of the circuit board 3, from which the fastening tongues 7 according to FIG. 1 are formed, is for example aluminium or copper.

Unlike in FIG. 1, it is likewise possible for the electrical bridge 9, as an alternative or in addition to a bonding wire, to comprise or consist of a metallic strip or a layer sequence of dielectric and electrically conductive layers applied to the circuit board top 30 and to the carrier top 40. A radiation-transmissive, in particular transparent, cover 13 is optionally arranged downstream of the semiconductor chips 5. A further optical system, not shown in the figures, is preferably arranged downstream of the cover 13 in a direction of emission.

Figure 2B:
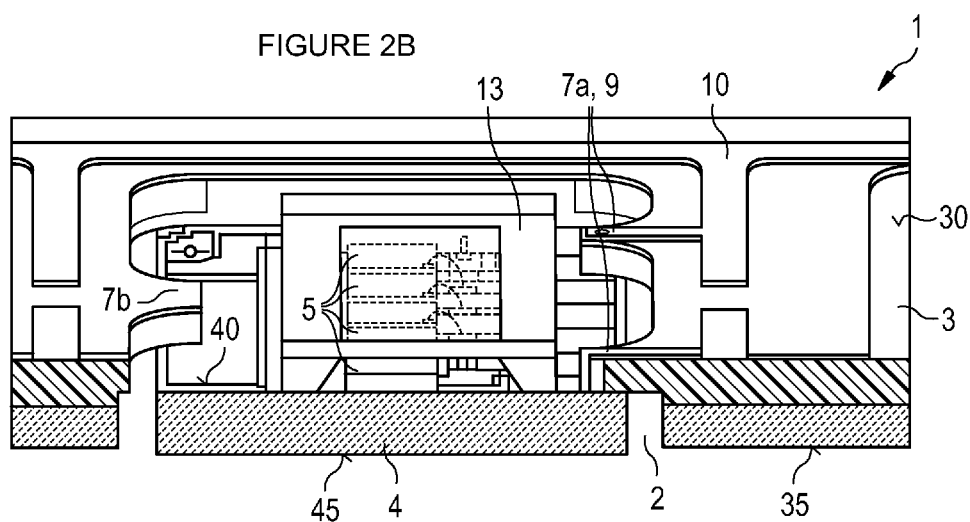
Figure 2C:
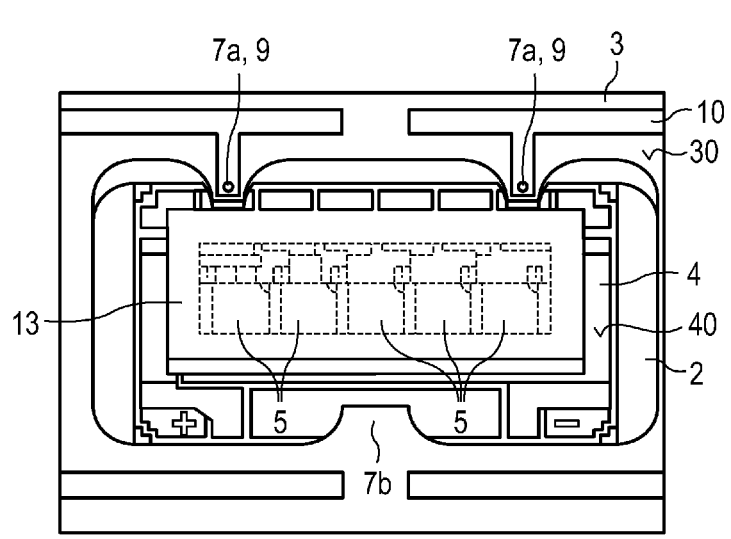

A further exemplary embodiment of the lighting module 1 is illustrated in FIG. 2, which includes FIGS. 2A-2C. The schematic plan view is shown in FIG. 2A, the perspective sectional representation is shown in FIG. 2B and the perspective plan view is shown in FIG. 2C.

The circuit board 3 according to FIG. 2 is likewise a metal core printed circuit board. The altogether three fastening tongues 7a, 7b are formed from an epoxide-based material of the circuit board 3, in particular from FR4, which covers the metal core of the circuit board 3 and on which the conductor tracks 10 are applied or formed by patterning. The fastening tongues 7a, 7b are soldered with conductor tracks on the carrier top 40. Furthermore, the two fastening tongues 7a comprise electrical vias, which connect the circuit board top 40 to the carrier top 40. Thus, in addition to providing a mechanical connection, the fastening tongues 7a effect electrical contacting of the carrier 4 and concomitantly of the optoelectronic semiconductor chips 5.

As in FIG. 1, the semiconductor chips 5 are connected electrically in series, such that for contacting the carrier 4 altogether only two electrical contacts are provided by means of the fastening tongues 7b. The three fastening tongues 7a, 7b in total results in three-point support of the carrier 4 on the circuit board 3, so achieving particularly stable mounting of the carrier 4 and uniform distribution of force to the fastening tongues 7a, 7b. Unlike in the illustration, it is possible, as also in all the other exemplary embodiments, for more than three fastening tongues to be present. The semiconductor chips 5 may likewise be connected optionally, as also in all the other exemplary embodiments, electrically in parallel and/or may be individually drivable or drivable in groups.

Figure 3:
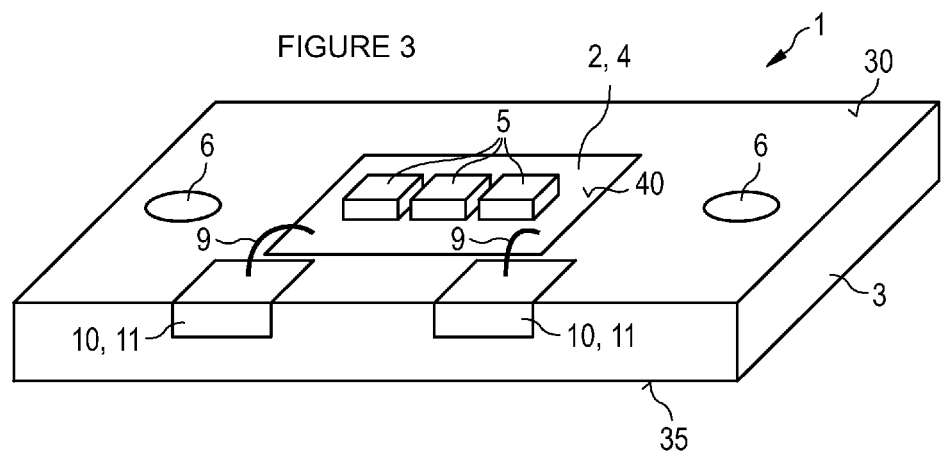

A further exemplary embodiment of the lighting module 1 is shown in perspective representation in FIG. 3. The circuit board 3 is an injection-moulded circuit carrier, MID for short, which surrounds the carrier 4 completely and form-fittingly in the lateral direction. The opening 2 in the circuit board 3 is completely filled by the carrier 4 with the semiconductor chips 5. In the exemplary embodiment according to FIG. 3 too, the carrier 4 projects beyond the circuit board 3 preferably on the circuit board bottom 35, not visible in FIG. 3.

The conductor tracks 10 and the solder pads 11 are integrated monolithically into the circuit board 3. The electrical bridges 9 are formed by bonding wires. As an alternative, the electrical bridges 9 may be formed by continuous electrically conductive layers, which may be applied directly onto the circuit board top 30 and onto the carrier top 40.

Figure 4A:
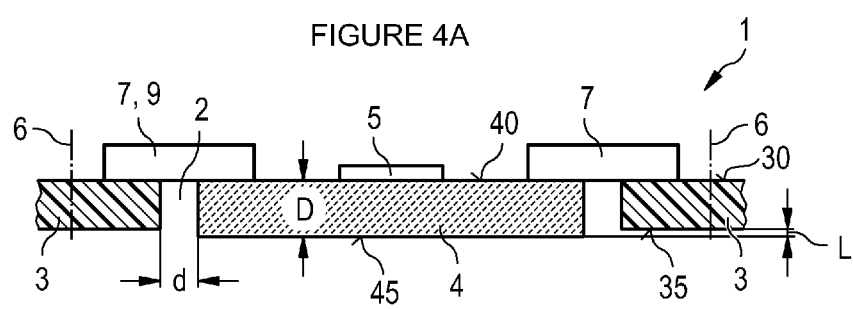

FIG. 4A shows a further exemplary embodiment of the lighting module 1 prior to mounting on a heat sink not shown in FIG. 4A. According to FIG. 4A, the fastening tongues 7 are produced separately from the circuit board 3 and soldered for example both onto the carrier 4 and onto the circuit board 3. Electrical contacting of the carrier 4 may likewise proceed via the fastening tongues 7.

The carrier 4 has a thickness D of for example between 200 µm and 1 mm inclusive, in particular between 300 µm and 700 µm inclusive, an average lateral distance d between the carrier 4 and the circuit board 3 amounting for example to approx. 200 µm. The amount L by which the carrier bottom 45 projects beyond the circuit board bottom 45 is preferably between 10 µm and 50 µm, as also in all the other exemplary embodiments.

Figure 4B:
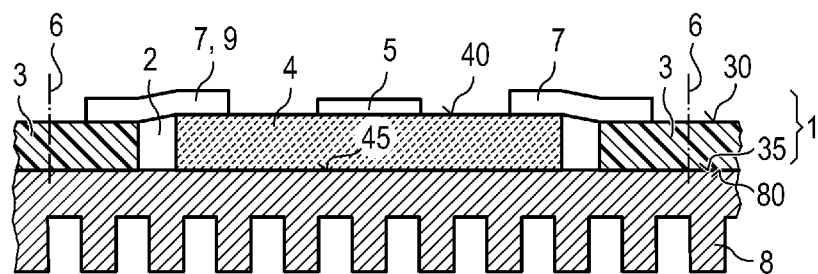

In FIG. 4B, the lighting module 1 may be seen mounted on the heat sink 8 which is not part of the lighting module 1, for example as is present in an automotive headlamp. Both the circuit board bottom 35 and the carrier bottom 45 lie flat on the planar top 80 of the heat sink 8. In other words, according to FIG. 4B the projection L is equal to 0, since the lighting module 1 is pressed onto the heat sink 8 by means of the fastening devices 6.

When pressed onto the heat sink 8, the fastening tongues 7 undergo resilient deformation, whereby the carrier 4 is pressed flat onto the heat sink top 80. The projection L, see FIG. 4A, thus brings about pre-tensioning of the fastening tongues 7, which translates, during mounting of the lighting module 1 on the heat sink 8, into mechanical contact pressure between the carrier 4 and the heat sink 8.

The carrier bottom 45 is as smooth as possible and has only slight average roughness, for example of less than 10 µm, like the heat sink top 80. There is no bonding agent, such as a solder or an adhesive, between the heat sink top 80 and the carrier bottom 45. The heat sink top 80 and the carrier bottom 45 rest directly against one another.

Figure 5A:
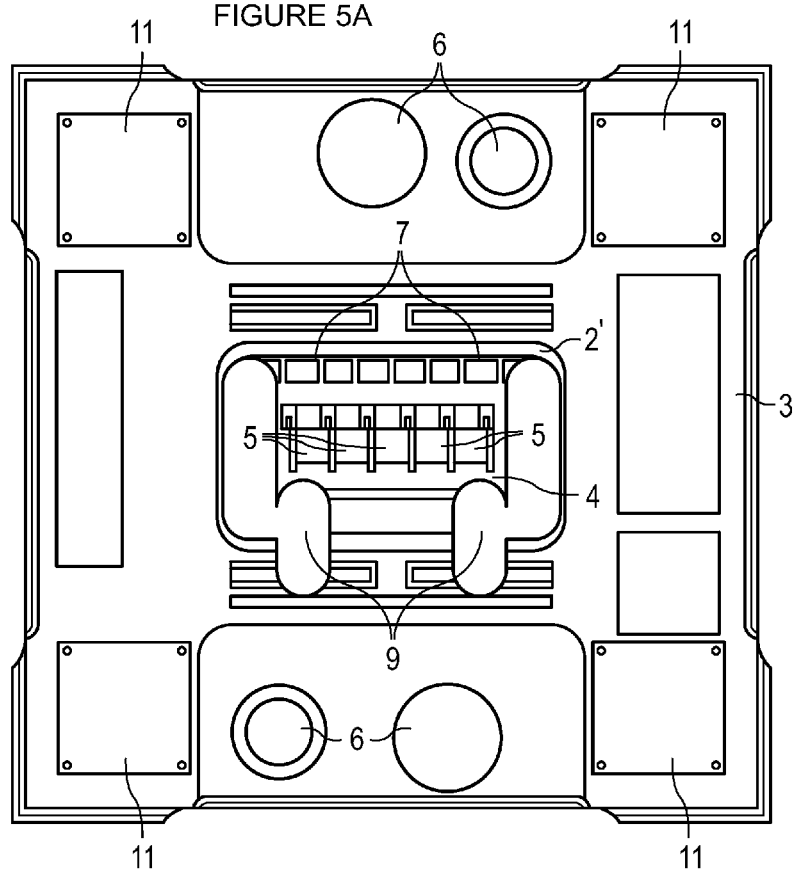
FIG. 5 is a schematic representation of a modified lighting module.
Figure 5B:
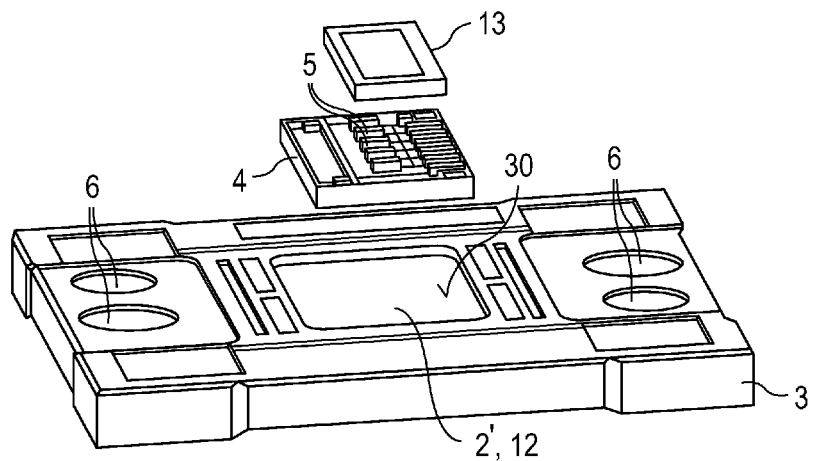

A modification of a lighting module is shown in plan view in FIG. 5A and in perspective view in FIG. 5B. In the opening 2' in the circuit board 3, the carrier 4 bearing the semiconductor chip 5 is adhesively bonded to the circuit board top 30 by means of a bonding agent layer 12. The opening 2' does not pass right through the circuit board 3, which comprises a comparatively thick metallic core, such that a type of trough is formed, in which the carrier 4 is mounted. A mechanical connection is produced between the carrier 4 and the circuit board 3 substantially only by way of the bonding agent layer 12. Since the bonding agent layer 12 lies between the circuit board 3 and the carrier 4, thermal resistance is greater compared with the exemplary embodiments according to FIGS. 1 to 4.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic lighting module comprising:
a circuit board with an opening passing through it, wherein a material of the circuit board is all around the opening and wherein the circuit board comprises a fastening device configured to fasten the lighting module mechanically to an external heat sink;
a carrier mounted in the opening; and
an optoelectronic semiconductor chip mounted on top of the carrier and electrically connected to the circuit board via the carrier;
wherein the circuit board is connected firmly mechanically to the carrier,
wherein the circuit board is designed to exert a mechanical force on the carrier and to press the carrier against the external heat sink,
wherein the carrier is designed to rest with a carrier bottom flat against the external heat sink,
wherein the carrier bottom is of a planar shape and a circuit board bottom are is of a planar shape and the carrier bottom is oriented parallel to the circuit board bottom and the carrier bottom and the circuit board bottom are freely accessible when the module is not mounted to the external heat sink,
wherein the carrier bottom projects out of the opening beyond the circuit board bottom by a length of at most 100 µm; and
wherein the lighting module can be handled as a single, integral unit.

2. The optoelectronic lighting module according to claim 1, wherein the circuit board is designed to press the carrier with a mechanical force of between 5 N and 100 N inclusive and/or with an average pressure of between 0.2 MPa and 20 MPa inclusive against the external heat sink.

3. The optoelectronic lighting module according to claim 1, wherein the module comprises a plurality of fastening tongues, wherein the fastening tongues extend as extensions of the top of the circuit board, partially cover the opening and are connected mechanically and/or electrically with the carrier top, and wherein the fastening tongues are designed to press the carrier against the external heat sink.

4. The optoelectronic lighting module according to claim 3, wherein the fastening tongues are formed in one piece with the circuit board.

5. The optoelectronic lighting module according to claim 3, wherein the fastening tongues comprise a resilient deformable material.

6. The optoelectronic lighting module according to claim 5, wherein the fastening tongues exhibit a spring constant, in a direction perpendicular to the carrier top, of between 50 kN/m and 5 MN/m inclusive.

7. The optoelectronic lighting module according to claim 3, wherein one or more of the fastening tongues are electrically insulated from the semiconductor chip.

8. The optoelectronic lighting module according to claim 1, wherein the circuit board is at an average distance between 150 µm and 750 µm inclusive, from the carrier in the lateral direction.

9. The optoelectronic lighting module according to claim 1, wherein the circuit board is an injection-molded injection moulded circuit carrier and completely surrounds the carrier in the lateral direction.

10. The optoelectronic lighting module according to claim 1, wherein a coefficient of thermal expansion of a material of the circuit board differs from a coefficient of thermal expansion of a material of the carrier by at most a factor of 4.

11. The optoelectronic lighting module according to claim 1, wherein a material of the carrier is more brittle at a temperature of 400 K than a material mechanically supporting the circuit board.

12. The optoelectronic lighting module according to claim 1, wherein the carrier comprises a ceramic or a semiconductor material or consists thereof, wherein a thickness of the carrier lies between 200 µm and 1 mm inclusive.

13. The optoelectronic lighting module according to claim 1, wherein the carrier bottom has an average roughness of at most 10 μm.

14. An automotive headlamp comprising:
the optoelectronic lighting module according to claim 1; and
the external heat sink, wherein the lighting module is fastened to a top surface of the heat sink.

15. The automotive headlamp according to claim 14, wherein the carrier is pressed against the heat sink via the circuit board;
wherein the circuit board is firmly mounted via the fastening device directly on the heat sink and there is no fastening device attached to the carrier, which is mounted on the heat sink via the circuit board; and
wherein the lighting module is free of a bonding agent or of a fastening device that is designed to connect the carrier directly firmly mechanically to the external heat sink.

16. The optoelectronic lighting module according to claim 1, further comprising the external heat sink, wherein the lighting module is fastened to a top surface of the heat sink.

17. An automotive headlamp comprising:
a circuit board with an opening passing through it, wherein a material of the circuit board is all around the opening;
a carrier mounted in the opening;
an optoelectronic semiconductor chip mounted on top of the carrier and electrically connected to the circuit board via the carrier;
a heat sink; and
a fastening device that mechanically fastens the circuit board to the heat sink;
wherein the circuit board is connected firmly mechanically to the carrier,
wherein the circuit board exerts a mechanical force on the carrier and presses the carrier against the heat sink,
wherein the carrier is designed to rest with a carrier bottom flat against the heat sink,
wherein the carrier bottom is of a planar shape and a circuit board bottom is of a planar shape and the carrier bottom is oriented parallel to the circuit board bottom,
wherein the circuit board is firmly mounted via the fastening device directly on the heat sink,
wherein the carrier is pressed directly against the heat sink via the circuit board so that the carrier bottom and the circuit board bottom are in physical contact with the heat sink; and
wherein the carrier is mounted on the heat sink by the circuit board and without any other bonding agent or fastening device to mechanically connect the carrier to the heat sink.

\* \* \* \* \*

UNITED STATES PATENT AND TRADEMARK OFFICE
CERTIFICATE OF CORRECTION

PATENT NO.        : 9,046,258 B2
APPLICATION NO.   : 13/695966
DATED             : June 2, 2015
INVENTOR(S)       : Frank Singer Page 1 of 1

It is certified that error appears in the above-identified patent and that said Letters Patent is hereby corrected as shown below:

Claims

In Col. 8, line 13, claim 1, delete "board bottom are is of a planar shape" and insert --board bottom is of a planar shape--.
In Col. 8, lines 53 - 54, claim 9, following injection-molded, delete "injection moulded".

Signed and Sealed this
Seventeenth Day of November, 2015

Michelle K. Lee
*Director of the United States Patent and Trademark Office*